United States Patent [19]
Abe et al.

[11] Patent Number: 5,559,819
[45] Date of Patent: Sep. 24, 1996

[54] SEMICONDUCTOR LASER DEVICE

[75] Inventors: Katsunori Abe, Chita-gun; Yuji Kimura, Nagoya; Kinya Atsumi; Yoshiki Ueno, both of Okazaki; Noriyuki Matsushita, Nagoya, all of Japan

[73] Assignee: Nippondenso Co., Ltd., Kariya, Japan

[21] Appl. No.: 423,345

[22] Filed: Apr. 18, 1995

[30] Foreign Application Priority Data

| Apr. 19, 1994 | [JP] | Japan | 6-080612 |
| Jul. 19, 1994 | [JP] | Japan | 6-166775 |
| Oct. 28, 1994 | [JP] | Japan | 6-264764 |
| Feb. 7, 1995 | [JP] | Japan | 7-019563 |

[51] Int. Cl.⁶ .................................................. H01S 3/19
[52] U.S. Cl. .................................................. 372/46; 372/45
[58] Field of Search ......................................... 372/45, 46

[56] References Cited

U.S. PATENT DOCUMENTS

| 4,315,226 | 2/1982 | Chinone et al. | 372/45 |
| 4,328,469 | 5/1982 | Scifres et al. | 372/45 |
| 4,740,977 | 4/1988 | Ikeda | 372/45 |
| 5,410,159 | 4/1995 | Sugawara et al. | 372/45 |

FOREIGN PATENT DOCUMENTS

| 51-38590 | 10/1976 | Japan . |
| 55-143092 | 11/1980 | Japan . |
| 61-79288 | 4/1986 | Japan . |
| 61-220392 | 9/1986 | Japan . |
| 414887 | 1/1992 | Japan . |
| 4-151887 | 5/1992 | Japan . |

*Primary Examiner*—James W. Davie
*Attorney, Agent, or Firm*—Cushman, Darby & Cushman

[57] ABSTRACT

The semiconductor laser device provides a large output laser beam approximating a circular shape. Formed on an n-GaAs substrate is an n-GaAs layer, further thereon in mesa type with an n-$Al_{0.4}Ga_{0.6}As$ clad layer, an n-$Al_{0.2}Ga_{0.8}As$ optical guide layer, an active layer formed of $Al_{0.2}Ga_{0.8}As$/GaAs multi-quantum well structure, a p-$Al_{0.2}Ga_{0.8}As$ optical guide layer, a p-$Al_{0.4}Ga_{0.6}As$ clad layer, and a p-GaAs layer. A thickness of the active layer is made equal to 127.5 nm, and a sum of thicknesses of the active layer and the optical guide layers and is made equal to or more than 1.5 μm. On the n-GaAs layer and the upper surface of mesa shaped portion are formed an insulating film and a p-type electrode, the stripe width of which is equal to 400 μm.

22 Claims, 7 Drawing Sheets

SEMICONDUCTOR LASER DEVICE

This application is based upon and claims the benefit of priority of the prior Japanese Patent applications No. 6-80612 filed on Apr. 19, 1994, No. 6-166775 filed on Jul. 19, 1994, No. 6-264764 filed on Oct. 28, 1994, and No. 7-19563 filed on Feb. 7, 1995, the contents of which are incorporated herein by reference.

BACKGROUND OF THE INVENTION

1. Field of the Invention

The present invention relates to a semiconductor laser device, and in particular, relates to a semiconductor laser device suitable used for a laser range finder which constitutes robot eyes or laser radar system or the like.

2. Related Arts

Recently, various systems are considered in which a semiconductor laser device is used as systems to measure a distance between two cars going in the same direction to observe a proper distance between such two cars, or to generates an alarm when too close to the car in front, or to brake the car. In these systems, an object in distance 100 m must be detected, this requires the semiconductor laser device an optical output having several tens watts (W) by pulse driving. Such large output semiconductor laser device has a structure as shown in FIG. 12, where an n-GaAs substrate 21 is laminated thereon with an n-GaAs layer 22 and an n-AlGaAs clad layer 23, and further thereon in manner of mesa type with an active layer 24, a p-AlGaAs clad layer 25, and a p-GaAs layer 26. The active layer means a layer which confines an injected carrier and recombines it to convert into a light. In addition, an insulating film 27 and a p-type electrode 28 are formed. The n-GaAs substrate 21 is provided on its backside with an n-type electrode 29 and an Au/Sn layer 30.

In general, several tens watts (W) of large output pulse semiconductor laser device is required to have at least a 100 µm or more in stripe width because of its large output as shown in FIG. 12. On the other hand, it is required that a carrier is confined in a small region and a thickness of the active layer 24 is made an extent of 0.1 µm in order to minimize a threshold current. Thus, in comparison with a wavelength, the large output pulse semiconductor laser device has a larger stripe width, and in addition, the active layer has a decreased thickness. Therefore, a diffraction of the light in the active layer expanding direction (horizontal direction) does not arise, but a diffraction in the active layer thickness direction (vertical direction) arises in a thickness direction thereof. This provides a beam with an ellipse shape expanding in the active layer thickness direction, where is provided an ellipticity (a ratio H/W of a major axis H and a minor axis W of a beam section in FIG. 13) of an extent of approximately 2.5 to 3.2.

An optical lens is used for converging the beam of laser light into a range having a desirous expansion angle, and a laser beam shape emitted may preferably approximate a circular shape as much as possible in view point of easier designing of the lens and miniaturization of the system, an ellipticity less than 2.5 being required.

A general means for obtaining a laser beam having a beam shape approximating a circular form, is disclosed in Japanese Patent Application Laid Open Sho-55-143092 in 1980, where a smaller output semiconductor laser device is used to form a lens portion with a high refractive index on the semiconductor. However, in forming the lens portion within the semiconductor, an additional process is required and this comes to a problem. To solve this, Japanese Patent Application Laid Open Hei-4-151887 teaches the laser beam approximating a circular shape without the lens portion, in which, similarly in the small output semiconductor laser device, optical guide layers (confining layers) having a low refractive index than that of the active layer are formed on upper and lower of the active layer further with the active layer width equal to or more than 0.5 µm and equal to or less than 1.5 µm. The term "optical guide layer" means a layer which acts to confine the light generated in the active layer and to guide the wave.

In a case where the semiconductor laser device disclosed in Japanese Patent Application Laid Open Hei-4-151887 in 1992 is used for a small output (several tens milliwatts (mW)) level of semiconductor laser device (a stripe width: several µm to several tens µm), the laser beam having a beam shape approximating a circular shape is obtained. However, in a case where the laser device is used for larger output pulse semiconductor laser device, the stripe width of which is 100 µm or more, it is found that the laser beam approximating the circular shape can not be obtained only when limiting a width of the active layer and using a structure of putting the active layer between the optical guide layers.

The foregoing designates that generally in the smaller output semiconductor laser device (a stripe width is less than 100 µm), because of the problem in varying of a light emission starting current (a threshold current), a particularly larger thickness is not available for the optical guide layer. It is therefore considered that, change of the beam shape is achieved only by varying a stripe width, or by changing a width of the active layer, or by adding a carrier barrier layer on both sides of the active layer (see Japanese Patent Application Laid Open Sho-61-79288 in 1986). Moreover, since a variation of the light emission starting current is considered to be arisen even in the semiconductor laser device having a stripe width equal to or more than 100 µm, only an ellipticity of an extent of 2.5 to 3.2 as described can be obtained in the large output semiconductor laser device.

SUMMARY OF THE INVENTION

An object of the present invention is to provide a semiconductor laser device capable of obtaining a laser beam having a beam shape approximating a circular shape in a large output of semiconductor laser device with a stripe width equal to or more than 100 µm.

The present inventors have found that an effect of the confining of light is determined by a sum of thicknesses of the optical guide layer and the active layer.

The present invention is to propose an semiconductor laser device having a stripe width equal to or more than 100 µm, comprises; an active layer which is injected of a carrier and generates a light by recombining the injected carrier; an optical guide layer which is disposed at least either side of upper or lower side of the active layer and formed of material having a refractive index substantially lower than that of the active layer to confine the light generated in the active layer; and clad layers formed on upper and lower of the active layer including the optical guide layer and formed of material having a refractive index substantially lower than that of the optical guide layer; wherein a sum of thicknesses of the active layer and optical guide layer is made equal to or more than 1.5 µm.

In concrete, the semiconductor laser device according to the present invention preferably comprises: a first conductivity type semiconductor substrate provided on a lower surface thereof with a lower surface electrode; a first conductivity type first clad layer which is formed on an upper surface on opposite side to the lower surface electrode of the semiconductor substrate; a first conductivity type first optical guide layer made of AlGaAs series material which is formed on the first clad layer and has a substantially higher refractive index than that of the first clad layer; an active layer made of AlGaAs series material which is formed on the first optical guide layer and has a substantially higher refractive index than that of the first optical guide layer and generates a light by recombining an injected carrier; a second conductivity type second optical guide layer made of AlGaAs series material which is formed on the active layer and has a substantially lower refractive index than that of the active layer; a second conductivity type second clad layer which is formed on the second optical guide layer and has a substantially lower refractive index than that of the second optical guide layer; and an upper surface electrode which is formed on the second clad layer and has a stripe width equal to or more than 100 μm, where a sum of thicknesses of the first optical guide layer and the active layer and the second optical guide layer is made equal to or more than 1.5 μm and equal to or less than 5.5 μm.

According to knowledge obtained by an experimentation by the present inventors, as a thickness of the optical guide layer is gradually made thicker, then a diffraction effect of the light in a thickness direction (vertical direction) of the optical guide layer comes smaller, the beam is made narrower in the thickness direction. On the other hand, a diffraction effect of the light in a optical guide layer expanding direction (horizontal direction) is not varied. In FIG. 4, a sum of thicknesses of the active layer and the optical guide layer is made equal to or more than 1.5 μm, thus the beam is found to approximate a circular shape. According to the present invention, there can be obtained the laser beam of a large output with a beam shape approximating a circular shape.

When the active layer is allowed to have a thickness equal to or more than 0.05 μm and equal to or less than 0.15 μm, then the carrier is confined only in a narrow region thereby to prevent increase of the threshold current and to eliminate deterioration of an optical output.

A constitution of the active layer and the optical guide layer and the clad layer with AlGaAs series material provides a beam ellipticity less than 2.5.

Of course, those active layer and optical guide layer and clad layer can also be made either material of InGaAlP series material, InGaAsP series material, InGaAsSb series material, or AlGaInN series material.

In order to maintain a circular shape of the beam, a sum of thicknesses of the active layer and the optical guide layer may preferably be equal to or less than 5.5 μm.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

First Embodiment

A first embodiment according to the present invention is described in detail with reference to the drawings.

Figure 1:
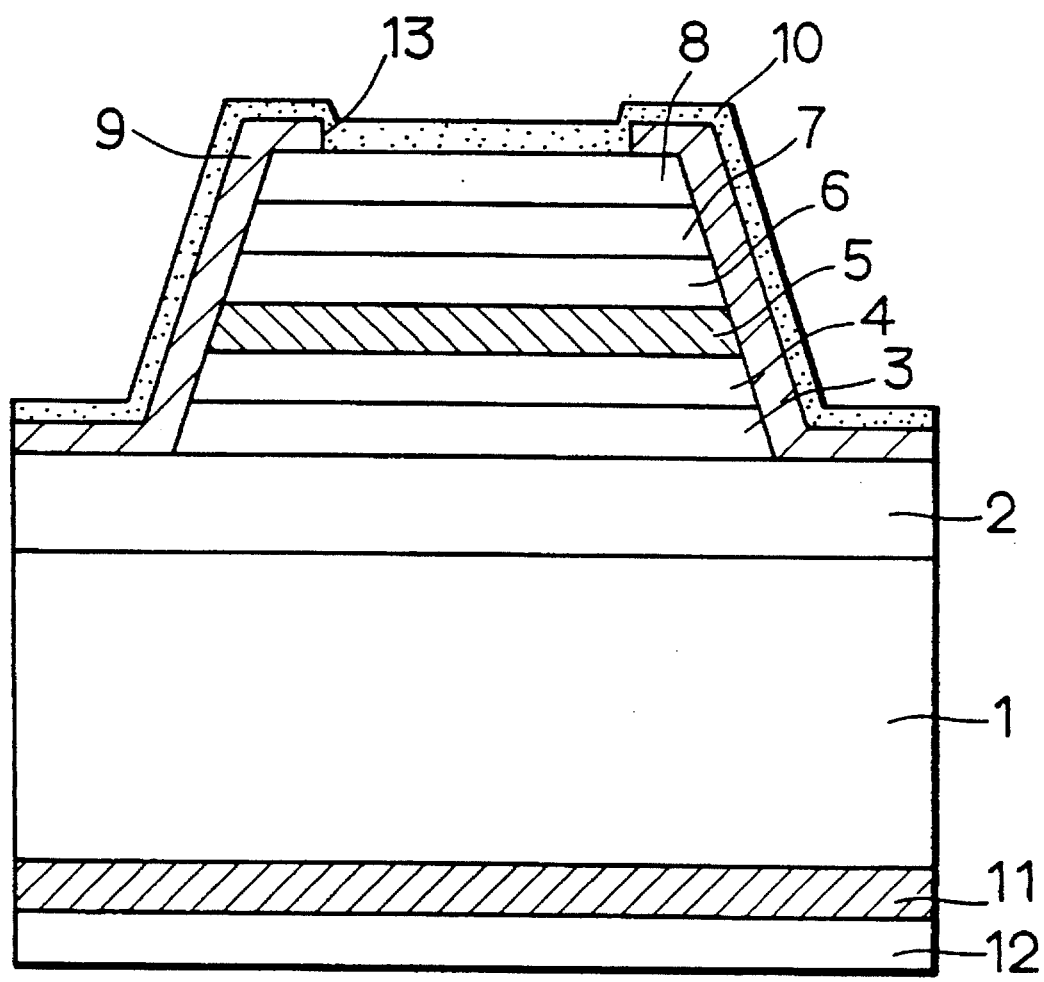
FIG. 1 is a sectional view of a large output semiconductor laser device of a first embodiment.
Figure 2:
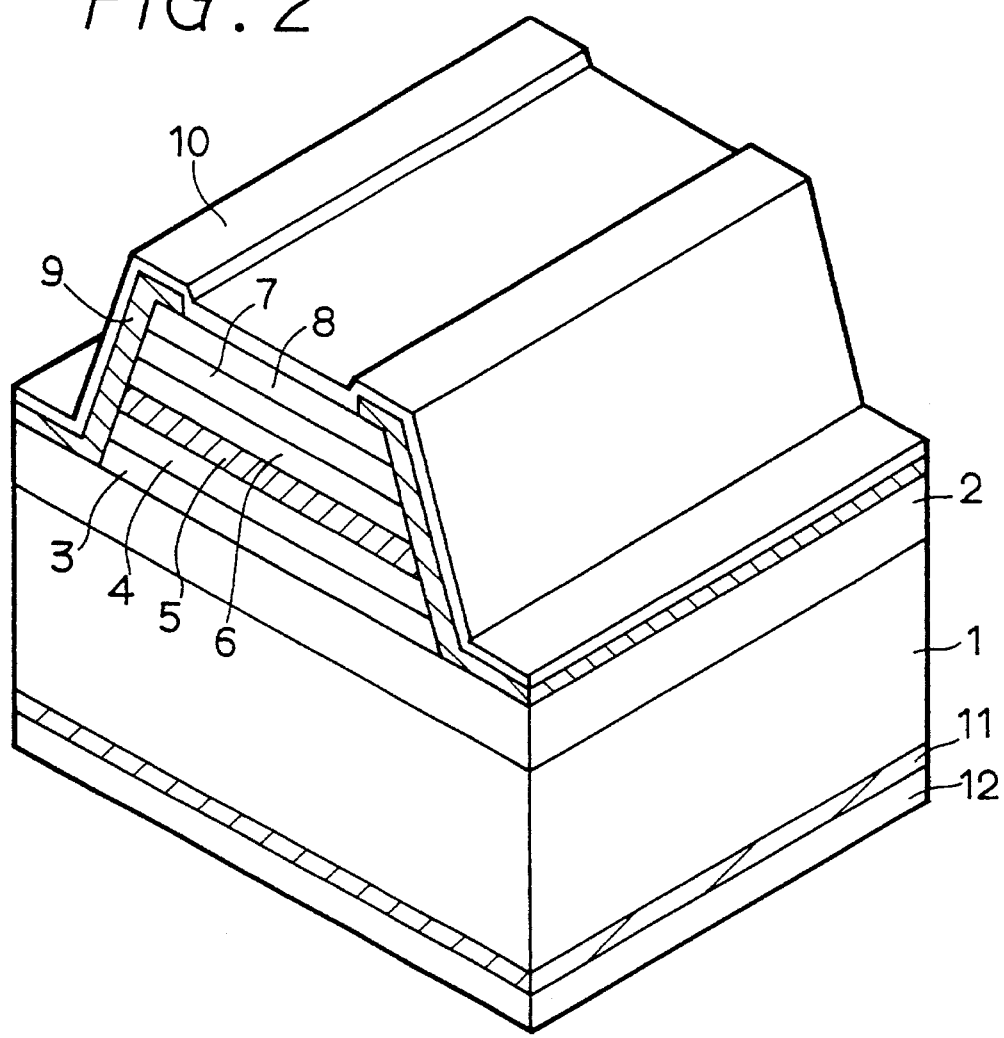
FIG. 2 is a perspective view of the large output semiconductor laser device of the first embodiment.
Figure 3:
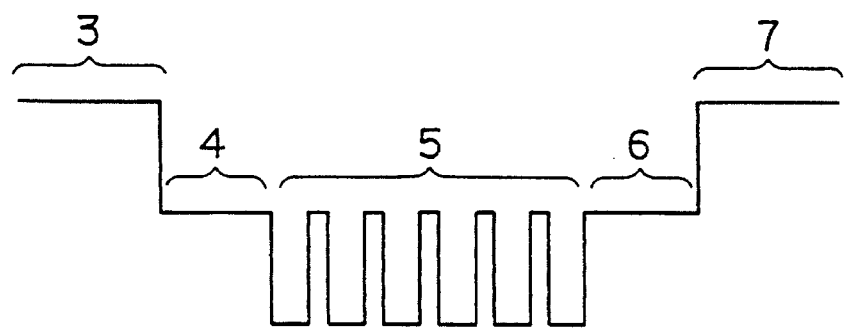
FIG. 3 is an illustrative view showing an energy band of the large output semiconductor laser device of the first embodiment.

FIG. 2 is a perspective view showing a large output semiconductor laser device of the first embodiment, FIG. 1 is a sectional view of the large output semiconductor laser device, and FIG. 3 is an illustrative view showing an energy band of the large output semiconductor laser device. The large output semiconductor laser device is adapted to be pulse driven.

An n-GaAs substrate 1 as a semiconductor substrate is laminated thereon sequentially with an n-GaAs layer 2, an n-$Al_{0.4}Ga_{0.6}As$ clad layer 3 as a first clad layer, an n-$Al_{0.2}Ga_{0.8}As$ optical guide layer 4 as a first optical guide layer, an active layer 5 made of multi-quantum well structure of $Al_{0.2}Ga_{0.8}As$/GaAs, a p-$Al_{0.2}Ga_{0.8}As$ optical guide layer 6 as a second optical guide layer, a P-$Al_{0.4}Ga_{0.6}As$ clad layer 7 as a second clad layer, and a p-GaAs layer 8. The active layer 5 is laminated alternatively with $Al_{0.2}Ga_{0.8}As$ layer and GaAs layer, forming five layers for $Al_{0.2}Ga_{0.8}As$ and six layers for GaAs. A mesa type is given to the clad layer 3, optical guide-layer 4, active layer 5, optical guide layer 6, clad layer 7 and GaAs layer 8. The active layer 5 is coated on its front end surface (section surface in FIG. 2) with a low reflection film, and on its back end surface with a high reflection film.

Each thickness is given by 500 nm (0.5 μm) for the n-GaAs layer 2, 1 μm for n-$Al_{0.4}Ga_{0.6}As$ clad layer 3, and 0 to 2.25 μm, for example 1 μm, for n-$Al_{0.2}Ga_{0.8}As$ optical guide layer 4. In the active layer 5, a thickness of one layer of $Al_{0.2}Ga_{0.8}As$ is equal to 7.5 nm (0.0075 μm), and a sum of thicknesses of total five layers of $Al_{0.2}Ga_{0.8}As$ comes to 37.5 nm (=7.5 nm×5 layers). A thickness of one layer of GaAs in the active layer 5 is equal to 15 nm (0.015 μm), and a sum of thicknesses of total six layers of GaAs comes to 90 nm (=15 nm×6 layers). Consequently, a thickness of the active layer 5 is equal to 127.5 nm, or 0.1275 μm.

Furthermore, each thickness is given by 0 to 2.25 μm, for example 1 μm, for p-$Al_{0.2}Ga_{0.8}As$ optical guide layer 6, 1 μm for p-$Al_{0.4}Ga_{0.6}As$ clad layer 7, and 0.8 μm for p-GaAs layer 8.

In the embodiment, the active layer 5 has a thickness of 127.5 nm, thus a total thicknesses of the active layer 5 and optical guide layers 4 and 6 is equal to or more than 1.5 μm.

A refractive index is 3.6 for the active layer 5 (average refractive index), 3.5 for the n-$Al_{0.2}Ga_{0.8}As$ optical guide layer 4 and p-$Al_{0.2}Ga_{0.8}As$ optical guide layer 6 respectively, and 3.3 for the n-$Al_{0.4}Ga_{0.6}As$ clad layer 3 and p-$Al_{0.4}Ga_{0.6}As$ clad layer 7 respectively. As shown in FIG. 3, the optical guide layers 4 and 6 are set to have a larger band gap than that of the active layer 5.

An insulating film 9 made of $SiO_2$ is formed on the n-GaAs layer 2 and a mesa type portion, and a window 13 without the insulating film 9 is formed on an upper surface of the mesa type portion. Further, thereon is formed a p-type electrode 10 as an upper electrode made of Cr/Au, which is in ohmic contact with the p-GaAs layer 8. A width of the window 13, i.e., a stripe width is equal to 400 μm.

The n-GaAs substrate 1 is formed on its back surface with the n-type electrode 11 as a lower surface electrode made of AuGe/Ni/Au, being in an ohmic contact with the n-GaAs substrate 1. The n-type electrode 11 is formed on its surface with an Au/Sn layer 12, which is an adhesion agent for adhering the semiconductor laser element with a Cu heat sink being a pedestal.

As shown in FIG. 2, the large output semiconductor laser device has a dimension of 500 μm length and 600 μm width.

Next, a method of manufacturing the large output semiconductor laser device is described.

First, on the n-GaAs substrate 1 is sequentially laminated, by MOCVD (metal organic chemical vapor deposition) method, the n-GaAs layer 2, n-$Al_{0.4}Ga_{0.6}As$ clad layer 3, n-$Al_{0.2}Ga_{0.8}As$ optical guide layer 4, active layer 5 formed of $Al_{0.2}Ga_{0.8}As$/GaAs multi-quantum well structure, p-$Al_{0.2}Ga_{0.8}As$ optical guide layer 6, p-$Al_{0.4}Ga_{0.6}As$ clad layer 7, and p-GaAs layer 8. Thereafter, the mesa type portion is formed by etching.

Continuously, on upper surface of the n-GaAs layer 2 and the mesa type portion are formed the insulating film 9 of $SiO_2$ by a plasma CVD method, and by etching, a window 13 is formed. The p-type electrode 10 made of Cr/Au is formed on the insulating film 9 by electron beam vapor deposition method, and thermal-treated at about 360° C. to be in ohmic contact therewith.

Following this, n-type electrode 11 made of AuGe/Ni/Au is formed on back surface of the n-GaAs substrate 1 by electron beam vapor deposition method, and thermal-treated to be in ohmic contact therewith. Thereafter, Au/Sn layer 12 is formed by electron beam vapor deposition method. Finally, a side-end surface thereof is made cleavage and the semiconductor laser chip is produced.

A pulse current is allowed to flow between the p-type electrode 10 and the n-type electrode 11 each of laser device, thereby, a positive hole is injected into the active layer 5 from the p-$Al_{0.4}Ga_{0.6}As$ clad layer 7 side, and electron is injected into the active layer 5 from the n-$Al_{0.4}Ga_{0.6}As$ clad layer 3 side, and resultant recombination provides light emission. Thus emitted light is repeated to reflect on both front and rear sides of cleaved side-end surfaces to be amplified and to be laser-oscillated, a laser beam is then emitted from the front end surface on which the low reflection coating film is formed.

Figure 4:
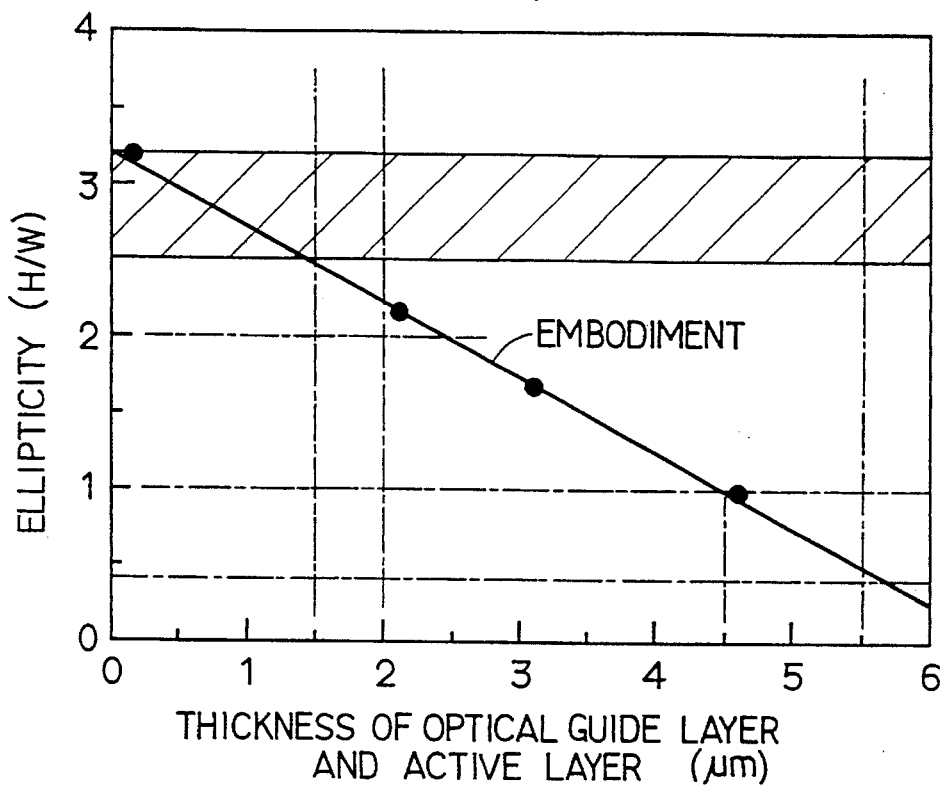
FIG. 4 is a graph showing the relationship of a sum of thicknesses of an active layer and an optical guide layer versus an ellipticity.
Figure 13:
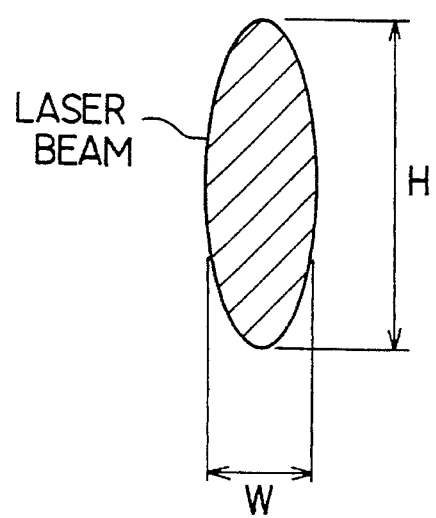
FIG. 13 is a sectional view showing a section of a beam.

FIG. 4 shows a result of measurement of an ellipticity of the beam (H/W in FIG. 13) when a sum of thicknesses of the active layer 5 and optical guide layers 4 and 6 is varied in way that a thickness of the active layer 5 is made 127.5 nm and the thicknesses of the n-$Al_{0.2}Ga_{0.8}As$ optical guide layer 4 and p-$Al_{0.2}Ga_{0.8}As$ optical guide layer 6 are varied. In this case, a film thickness of the optical guide layer 4 and a thickness of the optical guide layer 6 are equal to each other.

The followings are apparent from FIG. 4. A sum of thicknesses of the active layer 5 and optical guide layers 4 and 6 is made equal to or more than 1.5 μm, then a beam ellipticity smaller than 2.5 is obtained. When selecting 4.5 μm for a sum of thicknesses of the active layer 5 and the optical guide layers 4 and 6, there can be obtained an ellipticity of 1, that is, a beam approximating a complete circular shape. This is because a diffraction effect in an expansion direction (horizontal direction) of the optical guide layer is not varied in comparison that, as a film thickness of the optical guide layer is gradually increased, then the beam comes narrower with a decreased diffraction-effect of the light in a thickness direction (vertical direction) of the optical guide layer. As a consequence, an ellipticity of the beam can be controlled within an range from an extent of 1 to an extent of 3 (see FIG. 4). When employing 5.5 μm or less for a sum of thicknesses of the active layer 5 and optical guide layers 4 and 6, then a beam ellipticity can be made larger than 0.4 (1/2.5). This shows solely exchanging a major with a minor of ellipticity 2.5.

Figure 12:
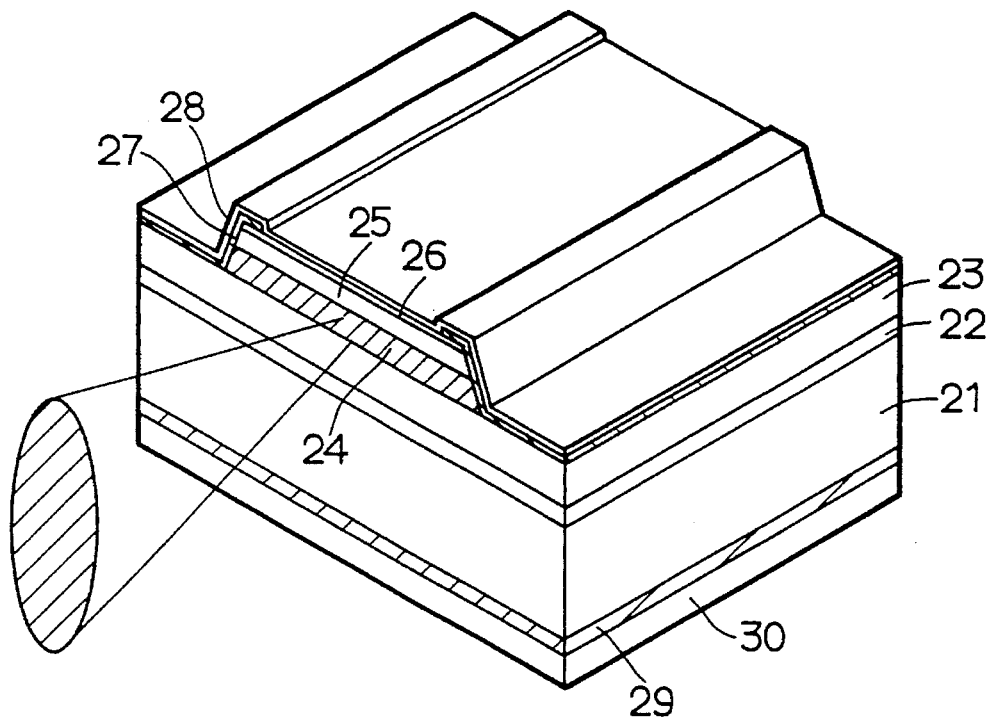
FIG. 12 is a perspective view of the conventional large output semiconductor laser device.

In FIG. 4, a region shown by hatching designates an ellipticity which is obtained by the large output semiconductor laser device in FIG. 12 (a semiconductor laser device without optical guide layer), such ellipticity being within a range approximately from 2.5 to 3.2.

When a thickness of the active layer 5 is selected to approximately 0.1 μm (0.1±0.05 μm), a carrier is confined in a narrow portion, thereby to be effectively recombined and lowered of a threshold current, and to prevent an optical output from being lowered.

In the foregoing, in order to obtain 1.5 μm or more for a sum of thicknesses of the active layer 5 and optical guide layers 4 and 6 and to obtain approximately 0.1 μm for a thickness of the active layer 5, then in the present embodiment, a sum of thicknesses of the optical guide layers 4 and 6 are set to be equal to or more than 1.5 μm.

Film thicknesses of the n-$Al_{0.2}Ga_{0.8}As$ optical guide layer 4 and p-$Al_{0.2}Ga_{0.8}As$ optical guide layer 6 may preferably be either of equal to or differing from each other.

The semiconductor laser device of this embodiment as described above is to specify a stripe width of 400 μm for large output, the optical guide layers 4 and 6 having a refractive index lower than that of the active layer 5 are provided on upper and lower of the active layer 5, clad layers 3 and 7 each having a lower refractive index than those of the optical guide layers 4 and 6 are disposed on upper and lower of the active layer 5 including the optical guide layers 4 and 6, and 1.5 μm or more is given for a sum of thicknesses of the active layer 5 and optical guide layers 4 and 6. Hence, as thicknesses of the optical guide layers 4 and 6 are gradually increased, the beam comes narrower with a decreased diffraction-effect of the light in the thickness direction (vertical direction) of the optical guide layer 4 and 6. On the other hand, a diffraction effect in an expanding direction (horizontal direction) of the optical guide layer 4 and 6 is not varied. In this way, a value of 1.5 μm or more for a sum of thicknesses of the active layer 5 and optical guide layer 4 and 6 provide a beam shape approximating a complete circular shape.

A thickness of the active layer 5 is determined to 0.1275 μm within a range from 0.05 to 0.15 μm, then the carrier is confined into a narrow region of the active layer 5, this also prevents increase of the threshold current and eliminates lowering of the optical output.

in addition to the above, the active layer 5 and optical guide layer 4, 6 and clad layer 3, 7 are constituted of AlGaAs series material. Thus, a sum of thicknesses of the active layer 5 and optical guide layer 4, 6 is made 1.5 μm or more, then a beam ellipticity can be smaller than 2.5. In this manner, this obtains a beam shape approximating a smaller circular shape having a beam ellipticity less than 2.5 with a large output being maintained as it is, facilitates designing and manufacturing the lens for converging, and enables manufacturing a laser device adapted to fit a requirement of the system.

Further, AlGaAs series material is used to obtain a laser having an oscillating wavelength of 0.8 μm band.

As described, generally in a smaller output semiconductor laser device (a stripe width is less than 100 μm), a satisfactory large thickness for the optical guide layer is not available because of arisen variation of the emission starting current (threshold current), therefore only a way to change the beam shape is considered to change a stripe width, to vary a width of the active layer, or to add a carrier barrier layer on both sides of the active layer (see Japanese Patent Application Laid Open Sho-61-79288 in 1986). The emission starting current change is considered to be generated even from the semiconductor laser device having a width equal to or more than 100 μm, thus, an ellipticity of only an extent of 2.5 to 3.2 is obtained in the large output semiconductor laser device as described above. However, the present inventors have found that, in a semiconductor laser device having a stripe width equal to or more than 100 μm, the threshold current (emission starting current) is almost not varied even in varying a thickness of the optical guide layer, and in addition, the beam shape can be controlled by positively changing a thickness of the optical guide layer and a thickness of the active layer. Also found is that the beam shape can be made smaller than 2.5 by giving 1.5 μm or more for a sum of thicknesses of the optical guide layer and the active layer.

Moreover, the present inventors have found that, when a large output is intended by pulse driving a current of several tens amperes in the large output semiconductor laser device, thus a relationship between the number of well layers and the optical output is different from the continuously driven small output semiconductor laser device. In the continuously driven small output type semiconductor laser device, a three layers of the quantum well layer for the active layer is suitable, which is taught as an example in Japanese Patent Application Laid Open Hei-4-14887 in 1992. This is because, with the well layer being increased, a control of laser oscillation wavelength comes difficult due to band filling effect. On the other hand, the inventors have studied and recognized in that, in the large output semiconductor laser device, there exists a far larger amount of injected carriers (electrons and positive holes) in the number of approximately 1,000 times in comparison with the small output semiconductor laser device, therefore with the number of well layers being reduced, the carriers are not confined into the well layers and result in over-flow, this comes in an inability to improve the optical output.

Specifically, as the number of well layers of the multi-quantum well of the active layer in the large output semiconductor laser device is gradually increased, then the number of carriers confined into the active layer is increased, and the optical output is more produced.

Figure 5:
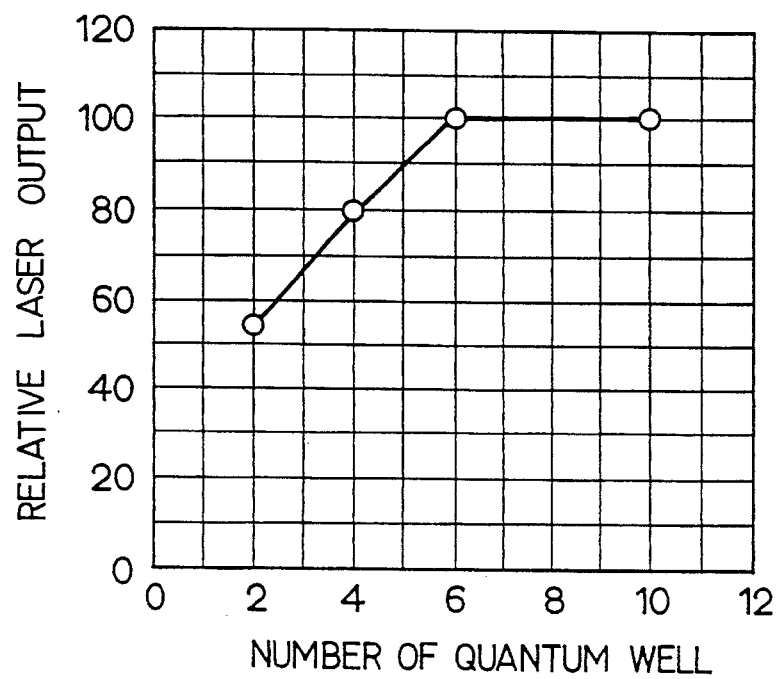
FIG. 5 is a graph showing the relationship between a number of quantum wells and a laser output.

FIG. 5 shows the number of GaAs layers in the multi-quantum well of the active layer 5, namely, the number of well layers, as well as a relative value (an optical output on a constant current) of the optical output when emitting in a pulse width 50 ns with a driving current 20 A. As is apparent from FIG. 5, as the number of well layers is gradually increased as 2, 4, 6, 10, the optical output increases. It is found that, with the number of well layers being more than 6, no overflow occurs in the carriers, which are allowed to effectively contribute to emission together with 100% of relative output being utilized. Data in current 20 A is shown here, however, the number of well layers must be more increased in order to increase the driving current and to obtain a large optical output. When the number of well layers is made equal to or more than 4, the carriers are confined into the well layers and the optical output is improved, thereby a desirous optical output can be obtained.

Figure 6:
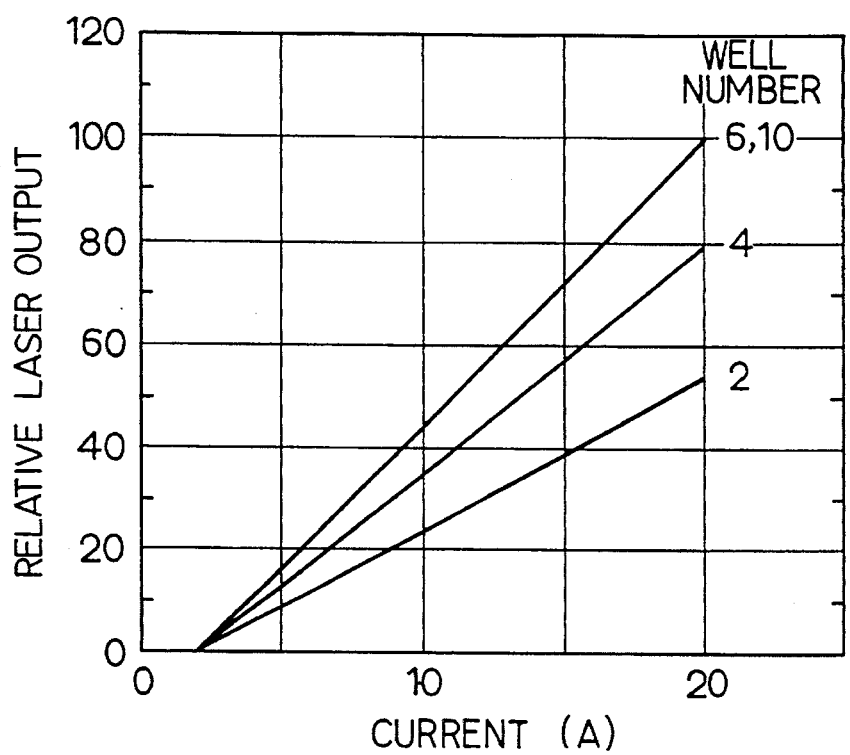
FIG. 6 is a characteristic diagram showing a laser output characteristic in a different number of quantum wells.

FIG. 6 shows a relationship between the driving current and the relative optical output in a different well layer number. If a driving current is varied, an optical output is increased with increase of the well layer number. In the well layer number of 6 and 10, both vary in the same manner because of a saturated condition. Thus, with the number of well layers being equal to or more than 4, or equal to or more than 6 in this embodiment, then a relative optical output is improved.

The present inventors have also found, an impurity concentration of a layer in contact with the active layer can be made lower than $5 \times 10^{17}$ cm$^{-3}$, thereby resulting in improving an inverse voltage resistance because a problem of heating is eliminated in the pulse driving type semiconductor laser device, differing from the continuous driving type semiconductor laser device.

In FIG. 1, an impurity concentration of n-$Al_{0.2}Ga_{0.8}As$ optical guide layer 4 in contact with lower of the active layer 5 is made equal to $2 \times 10^{16}$ cm$^{-3}$, and an impurity concentration of p-$Al_{0.2}Ga_{0.8}As$ optical guide layer 6 in contact with upper of the active layer 5 is made equal to $1 \times 10^{18}$ cm$^{-3}$. A concentration of a layer having a lower impurity concentration from among the upper and lower layers in contact with the active layer, is made equal to or less than $1 \times 10^{17}$ cm$^{-3}$, thereby an inverse peak voltage resistance can largely be enhanced.

Figure 7:
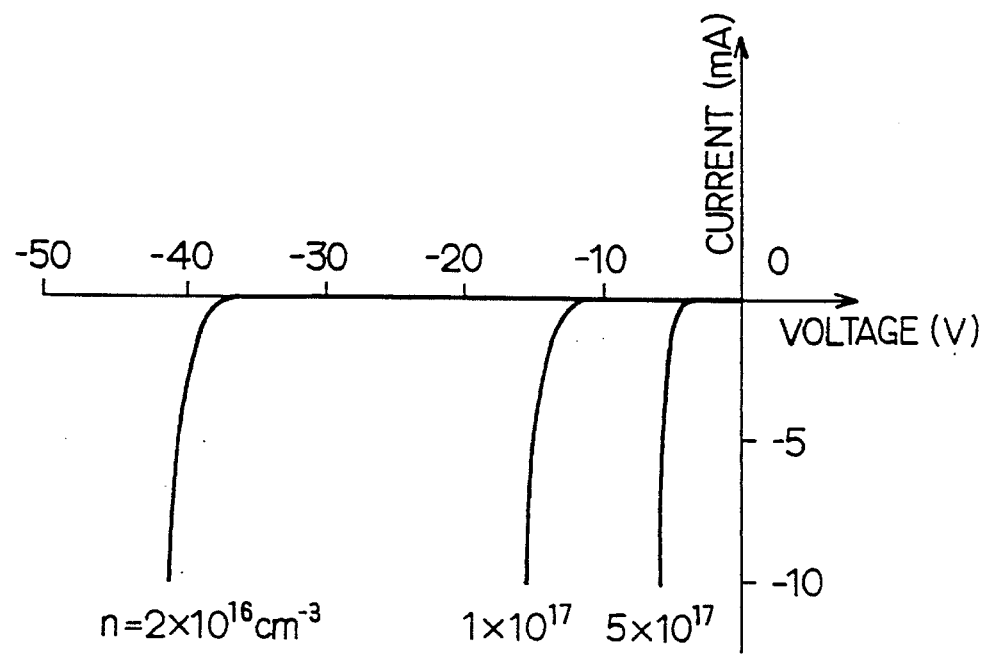
FIG. 7 is a characteristic diagram showing the relationship of voltage-current in a reverse direction of the large output semiconductor laser device.

In detail, an inverse peak voltage resistance of p-n junction is determined depending on a concentration of a layer having a lower impurity concentration, then when a concentration of a layer having a lower impurity concentration from among the upper and lower layers in contact with the active layer is made equal to or less than $1 \times 10^{17}$ cm$^{-3}$, thereby an inverse peak voltage resistance of the semiconductor laser device comes less than 16 V as shown in FIG. 7, an inverse voltage resistance equal to or more than two times those of the continuous driving type semiconductor laser device having a layer of $5 \times 10^{17}$ cm$^{-3}$ can be obtained. The impurity concentration is further lowered and made $2 \times 10^{16}$ cm$^{-3}$, an inverse peak voltage resistance is further improved to as high as 42 V.

In this way, an inverse peak voltage resistance becomes larger by lowering either one impurity concentration of those of an upper layer or a lower layer each in contact with the active layer. In this case, since the semiconductor laser device is pulse-driven, heating of elements by increase of the number of series resistances is not a problem, unlike the case of the continuously driven semiconductor laser device.

In the foregoing, an inverse peak voltage resistance can be made larger, then even if the inverse voltage is applied by noise or the like from a driving circuit of the semiconductor laser device, or from the external, a dielectric breakdown of the semiconductor laser device is prevented, results in improvement of a reliability.

When using n-type for an electric conductivity type of a layer having a lower impurity concentration, the carriers are electrons, thereby effective mass is smaller with a large mobility in comparison with a case of p-type for the conductivity type, an increase of resistance due to series resistances can be suppressed.

Second Embodiment

Next, the second embodiment is described mainly commenting on a difference from the first embodiment in the followings.

Figure 8:
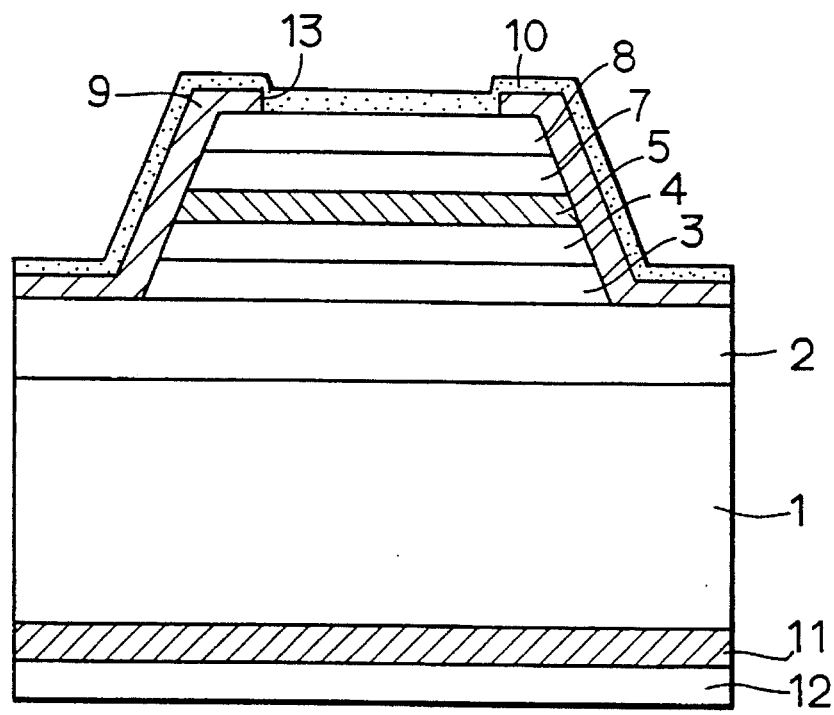
FIG. 8 is a sectional view of a large output semiconductor laser device of a second embodiment.
Figure 9:
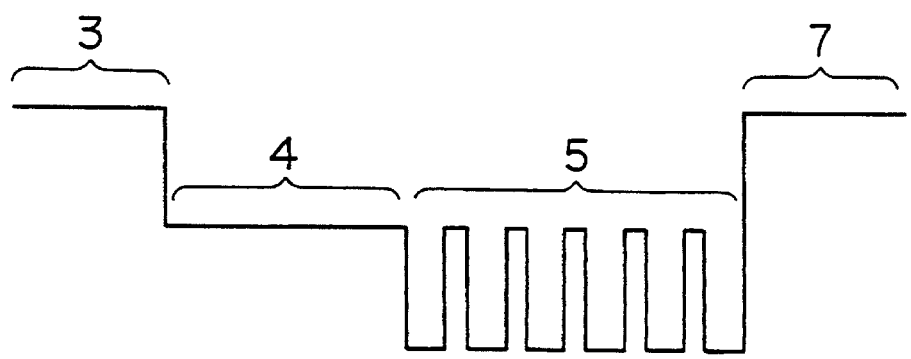
FIG. 9 is an illustrative view showing an energy band of the large output semiconductor laser device of the second embodiment.

A large output semiconductor laser device of the present embodiment, as shown in FIGS. 8 and 9, only under the active layer 5 is provided the n-$Al_{0.2}Ga_{0.8}As$ optical guide layer 4, and on upper of the active layer 5 is not provided optical guide layer. As a result, electrons being carriers are injected into the active layer 5 through the n-$Al_{0.2}Ga_{0.8}As$ optical guide layer 4 from the n-$Al_{0.4}Ga_{0.6}As$ clad layer 3, positive holes being the other carriers are directly injected into the active layer 5 from the p-$Al_{0.4}Ga_{0.6}As$ clad layer 7. Thus, for a distance where electrons and positive holes being carriers reach to the active layer 5, a distance for the positive holes is shorter than that for the electrons. Accordingly, with an entire resistance being reduced, heating of the elements is suppressed, resulting in improvement of a reliability. Also in this case, similarly as in the first embodiment, a beam shape where an ellipticity is lower than 2.5 can be obtained by determining a total film thickness equal to or more than 1.5 μm for the active layer 5 and the n-$Al_{0.2}Ga_{0.8}As$ optical guide layer 4.

It is understood that the present invention is not limited to the respective embodiments as hereinbefore described. For example, in the embodiments, a stripe width is equal to 400 μm. However according to the invention, any of semiconductor laser devices having a stripe width equal to or more than 100 μm may preferably be applied. In addition to the above, the invention may preferably be applied to any of direct-current driving (CW: Continuous Wave) semiconductor laser devices other than the pulse driving semiconductor laser device. In the embodiments, the active layer and the optical guide layer and the clad layer are constructed of AlGaAs series material. However according to the invention, those layers may preferably be formed of any other materials such as InGaAlP, InGaAsP, InGaAsSb, and AlGaInN series or the like. In this case, a beam ellipticity can be substantially equal to or less than 2 by giving a total thickness equal to or more than 2.5 μm and equal to or less than 5.5 μm for the active layer 5 and the optical guide layers. Thus, a laser having an oscillating wavelength depending on materials can be obtained.

Figure 10:
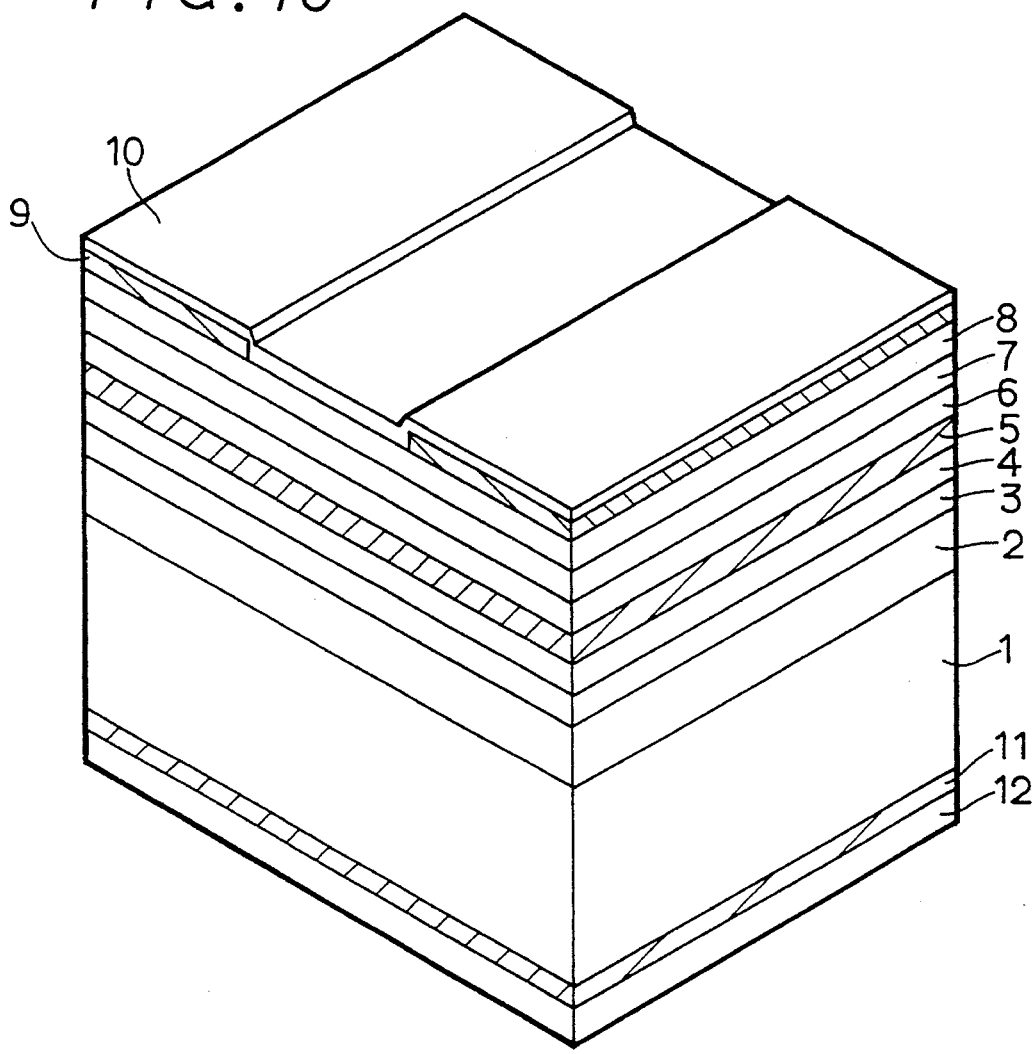
FIG. 10 is a perspective view of a large output semiconductor laser device of another embodiment.

In the embodiment, a mesa type semiconductor laser device is used for explanation. However according to the invention, semiconductor laser devices which are not of mesa type may preferably be employed, as shown in FIG. 10.

Figure 11:
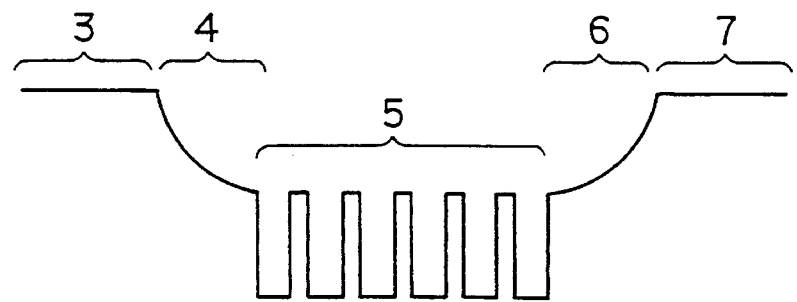
FIG. 11 is an illustrative view showing an energy band of a large output semiconductor laser device of another embodiment.

Moreover, the present invention can be applied to a semiconductor laser device having a GRIN-SCH (graded-index separate confinement heterostructure) structure. Specifically, this is formed by continuously varying Al composition x in a range from x=0.2 to x=0.4 with respect to the n-$Al_xGa_{1-x}As$ optical guide layer 4 and the p-$Al_xGa_{1-x}As$ optical guide layer 6 as shown in FIG. 11.

In the embodiments, Al composition of the n-$Al_xGa_{1-x}As$ optical guide layer 4 and the p-$Al_xGa_{1-x}As$ optical guide layer 6 are continuously varied to also continuously vary the energy band. Therefore, the carriers extruded from the well layer return at the continuous variation portion, a confinement for the carriers is effectively performed, an effect of increase of the laser output further noticeably appears by increasing the number of quantum well layers.

In the embodiment, a thickness of one layer of the GaAs in the active layer 5 is made 15 nm. However according to the invention, such thickness is not limited to those in the embodiments, where such value equal to or less than 30 nm appearing a quantum effect is normally employed, and a value from 2.5 nm to 20 nm is suitable in consideration of the characteristic and a uniformity of film formation.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor laser device having a stripe width of 100 μm or more, comprising:
   an active layer which is injected of a carrier and generates a light by recombining the injected carrier;
   an optical guide layer which is formed at least either side of upper or lower side of the active layer and formed of material having a refractive index substantially lower than that of the active layer to confine the light generated in the active layer; and
   clad layers formed on upper and lower of the active layer including the optical guide layer, formed of material having a refractive index substantially lower than that of the optical guide layer,
   wherein a sum of thicknesses of the active layer and optical guide layer is made equal to or more than 1.5 μm.

2. A semiconductor laser device as claimed in claim 1, wherein a thickness of the active layer is made equal to or more than 0.05 μm and equal to or less than 0.15 μm.

3. A semiconductor laser device as claimed in claim 1, wherein the active layer, the optical guide layer and the clad layer are made of AlGaAs series material.

4. A semiconductor laser device as claimed in claim 2, wherein the active layer, the optical guide layer and the clad layer are made of AlGaAs series material.

5. A semiconductor laser device as claimed in claim 1, wherein the active layer, the optical guide layer and the clad layer are made of either material of InGaAlP series material, InGaAsP series material, InGaAsSb series material, or AlGaInN series material.

6. A semiconductor laser device as claimed in claim 1, wherein the sum of thicknesses of the active layer and the optical guide layer is made equal to or less than 5.5 μm.

7. A semiconductor laser device as claimed in claim 2, wherein the sum of thicknesses of the active layer and the optical guide layer is made equal to or less than 5.5 μm.

8. A semiconductor laser device as claimed in claim 3, wherein the sum of thicknesses of the active layer and the optical guide layer is made equal to or less than 5.5 μm.

9. A semiconductor laser device as claimed in claim 5, wherein the sum of thicknesses of the active layer and the optical guide layer is made equal to or less than 5.5 μm.

10. A semiconductor laser device as claimed in claim 1, wherein an n-type clad layer is disposed on one-side surface of the active layer with an n-type optical guide layer interposed therebetween and a p-type clad layer is disposed on the other-side surface of the active layer.

11. A semiconductor laser device as claimed in claim 2, wherein an n-type clad layer is disposed on one-side surface of the active layer with an n-type optical guide layer interposed therebetween and a p-type clad layer is disposed on the other-side surface of the active layer.

12. A semiconductor laser device as claimed in claim 3, wherein an n-type clad layer is disposed on one-side surface of the active layer with an n-type optical guide layer interposed therebetween and a p-type clad layer is disposed on the other-side surface of the active layer.

13. A semiconductor laser device as claimed in claim 6, wherein an n-type clad layer is disposed on one-side surface of the active layer with an n-type optical guide layer interposed therebetween and a p-type clad layer is disposed on the other-side surface of the active layer.

14. A semiconductor laser device as claimed in claim 1, wherein the clad layer comprises a first clad layer of a first conductivity type formed on one-side surface of the active layer, and a second clad layer of a second conductivity type formed on the other-side surface of the active layer, and further comprising a semiconductor substrate formed on the first clad layer side, a lower surface electrode formed on opposite side to the first clad layer of the semiconductor substrate, and a stripe width equal to or more than 100 μm formed on the second clad layer.

15. A semiconductor laser device as claimed in claim 2, wherein the clad layer comprises a first clad layer of a first conductivity type formed on one-side surface of the active layer, and a second clad layer of a second conductivity type formed on the other-side surface of the active layer, and further comprising a semiconductor substrate formed on the first clad layer side, a lower surface electrode formed on opposite side to the first clad layer of the semiconductor substrate, and a stripe width equal to or more than 100 μm formed on the second clad layer.

16. A semiconductor laser device as claimed in claim 3, wherein the clad layer comprises a first clad layer of a first conductivity type formed on one-side surface of the active layer, and a second clad layer of a second conductivity type formed on the other-side surface of the active layer, and further comprising a semiconductor substrate formed on the first clad layer side, a lower surface electrode formed on opposite side to the first clad layer of the semiconductor substrate, and a stripe width equal to or more than 100 μm formed on the second clad layer.

17. A semiconductor laser device as claimed in claim 6, wherein the clad layer comprises a first clad layer of a first conductivity type formed on one-side surface of the active layer, and a second clad layer of a second conductivity type formed on the other-side surface of the active layer, and further comprising a semiconductor substrate formed on the first clad layer side, a lower surface electrode formed on opposite side to the first clad layer of the semiconductor substrate, and a stripe width equal to or more than 100 μm formed on the second clad layer.

18. A semiconductor laser device as claimed in claim 1, wherein the active layer is of a multi-quantum well structure which is alternatively laminated with a well layer and a semiconductor layer made of semiconductor materials having different compositions from the well layer, and the well layer is of at least four layers.

19. A semiconductor laser device as claimed in claim 18, wherein the well layer is of six or more layers.

20. A semiconductor laser device as claimed in claim 1, wherein the optical guide layer comprises a first optical guide layer which is formed on one-side surface of the active layer and has an impurity concentration equal to or lass than $1 \times 10^{17}$ cm$^{-3}$, and a second optical guide layer which is formed on the other-side surface of the active layer and has an impurity concentration higher than that of the first optical guide layer.

21. A semiconductor laser device as claimed in claim 20, wherein the first optical guide layer is made of an n-type semiconductor material.

22. A semiconductor laser device comprising:

a semiconductor substrate of a first conductivity type provided with a lower surface electrode on a lower surface thereof;

a first clad layer of a first conductivity type formed on upper surface on opposite side to the lower surface electrode of the semiconductor substrate;

a first optical guide layer of a first conductivity type which is formed on the first clad layer and has a refractive index substantially higher than that of the first clad layer and is made of AlGaAs series material;

an active layer which is formed on the first optical guide layer and made of AlGaAs series material and has a refractive index substantially higher than that of the first optical guide layer and generates the light by recombining the injected carrier;

a second optical guide layer of a second conductivity type which is formed on the active layer and has a refractive index substantially lower than that of the active layer and is made of AlGaAs series material;

a second clad layer of a second conductivity type which is formed on the second optical guide layer and has a refractive index substantially lower than that of the second optical guide layer; and an upper surface electrode formed on the second clad layer, having a stripe width equal to or more than 100 μm, wherein a sum of thicknesses of the first optical guide layer, the active layer and the second optical guide layer is made equal to or more than 1.5 μm and equal to or less than 5.5 μm.

* * * * *